United States Patent [19]

Nakata et al.

[11] Patent Number: 5,025,281

[45] Date of Patent: Jun. 18, 1991

[54] IMAGE RECORDING APPARATUS USING PHOTOSENSITIVE PRESSURE-SENSITIVE RECORDING MEDIUM

[75] Inventors: Takashi Nakata, Nagoya; Takashi Tomizawa, Aichi; Shigeyuki Hayashi, Nagoya; Motoshi Ohno, Nagoya; Yoichi Horaguchi, Nagoya, all of Japan

[73] Assignee: Brother Kogyo Kabushiki Kaisha, Aichi, Japan

[21] Appl. No.: 283,845

[22] Filed: Dec. 13, 1988

[30] Foreign Application Priority Data

Dec. 15, 1987 [JP] Japan .................................. 62-317849

[51] Int. Cl.$^5$ ...................... G03B 27/32; G03B 27/52
[52] U.S. Cl. ......................................... 355/27; 355/55
[58] Field of Search ................... 355/200, 210, 18, 27, 355/243, 52, 55

[56] References Cited

U.S. PATENT DOCUMENTS

| | | | |
|---|---|---|---|
| 3,776,629 | 12/1973 | Ogawa | 355/27 X |
| 4,501,490 | 2/1985 | Miyamoto et al. | 355/243 X |
| 4,742,374 | 5/1988 | Yamamoto et al. | 355/27 |
| 4,777,513 | 10/1988 | Nelson | 355/27 |
| 4,785,332 | 11/1988 | Nagumo et al. | 355/27 |
| 4,806,982 | 2/1989 | Yamamoto et al. | 355/27 |
| 4,893,147 | 1/1990 | Tanabe et al. | 355/27 |

Primary Examiner—Fred L. Braun
Attorney, Agent, or Firm—Oliff & Berridge

[57] ABSTRACT

An image recording apparatus employs a transfer type recording medium which includes a photosensitive pressure-sensitive recording sheet and a developer sheet. The former sheet is exposed to light to form a latent image corresponding to an image of an original. This sheet is exposed to light while being transported at a speed equal to or in the case of making a copy of enlarged or reduced size, at a speed different from a speed at which the original is scanned by light. The photosensitive pressure-sensitive recording sheet on which the latent image is formed is brought into facial contact with the developer sheet and the latent image is developed under pressure to provide a visible image on the developer sheet. This developing operation is performed while moving the superposed two sheets at the same speed as the speed when the latent image is formed on the photosensitive pressure-sensitive recording sheet. Since both the exposure and developing operations can be performed substantially simultaneously, the copying speed is increased. Further, no receiving unit needs to be provided in a position between the exposure unit and the developing unit, which may otherwise be needed for receiving the exposed recording sheet if development is performed upon completion of the exposure. Thus, the overall apparatus can be made compact in size.

8 Claims, 2 Drawing Sheets

IMAGE RECORDING APPARATUS USING PHOTOSENSITIVE PRESSURE-SENSITIVE RECORDING MEDIUM

BACKGROUND OF THE INVENTION

The present invention relates to an image recording apparatus such as a copying machine or a printer, and more paticularly to such an image recording apparatus using a photosensitive pressure-sensitive recording medium.

In a conventional image recording apparatus, light emitted from a light source is irradiated onto an original and a photosensitive pressure-sensitive recording medium is exposed to light which has passed through or reflected from the original to form a latent image on the recording medium. At the time of light exposure, the recording medium is conveyed at a speed equal to or at a speed different from the moving speed of an original support stand glass on which the original is placed. Upon completion of the exposure, the recording medium is fed between a pair of pressure rollers serving as a developing unit where pressure is applied to the recording medium to develop the latent image and provide a visible image.

In the conventional apparatus, the pressure development is carried out after exposure of the entire surface of the original is completely terminated. Therefore, it has been necessary to provide a receiving unit for receiving the exposed medium in a position between the exposure unit and the developer unit. The provision of this receiving unit causes to enlarge the overall size of the apparatus. Besides, a period of time for completion of copying is prolonged, since the development is not taken place simultaneous with the exposure.

SUMMARY OF THE INVENTION

Accordingly, an object of this invention is to provide an image recording apparatus which is compact in size by eliminating a receiving unit for receiving the exposed recording medium.

Another object of this invention is to provide an image recording apparatus in which recording speed is increased by substantially simultaneously processing both the light exposure and pressure-development.

In order to achieve the above and other objects, there is provided an image recording apparatus for recording an image of an original on an image recording medium, said image recording medium having an imaging surface capable of forming a latent image thereon when exposed to light, said apparatus comprising:

a pair of main frames defining an internal space therebetween;

a light source for irradiating light;

an original support unit for supporting said original to receive the light irradiated from said light source, said unit and said light source being movable at a first speed relative to each other so that said image on said original is sequentially scanned by said light;

an optical system secured to said main frames for receiving light reflected from said original and providing an image bearing light;

an exposure unit disposed within said internal space and defining an exposure zone along which said image recording medium is travelled wherein said image bearing light is directed to said image recording medium to form a latent image thereon;

a first driving unit for moving said recording medium at a second speed when said recording medium travels along the exposure zone;

a developing unit disposed downstream of said exposure unit and provided with a developing zone for developing said latent image; and a second driving unit for moving said recording medium at a speed substantially equal to said second speed when said recording medium is developed by said developing unit.

DETAILED DESCRIPTION OF THE PREFERRED EMBODIMENTS

A preferred embodiment of this invention will be described below with reference to FIG. 1.

Figure 1:
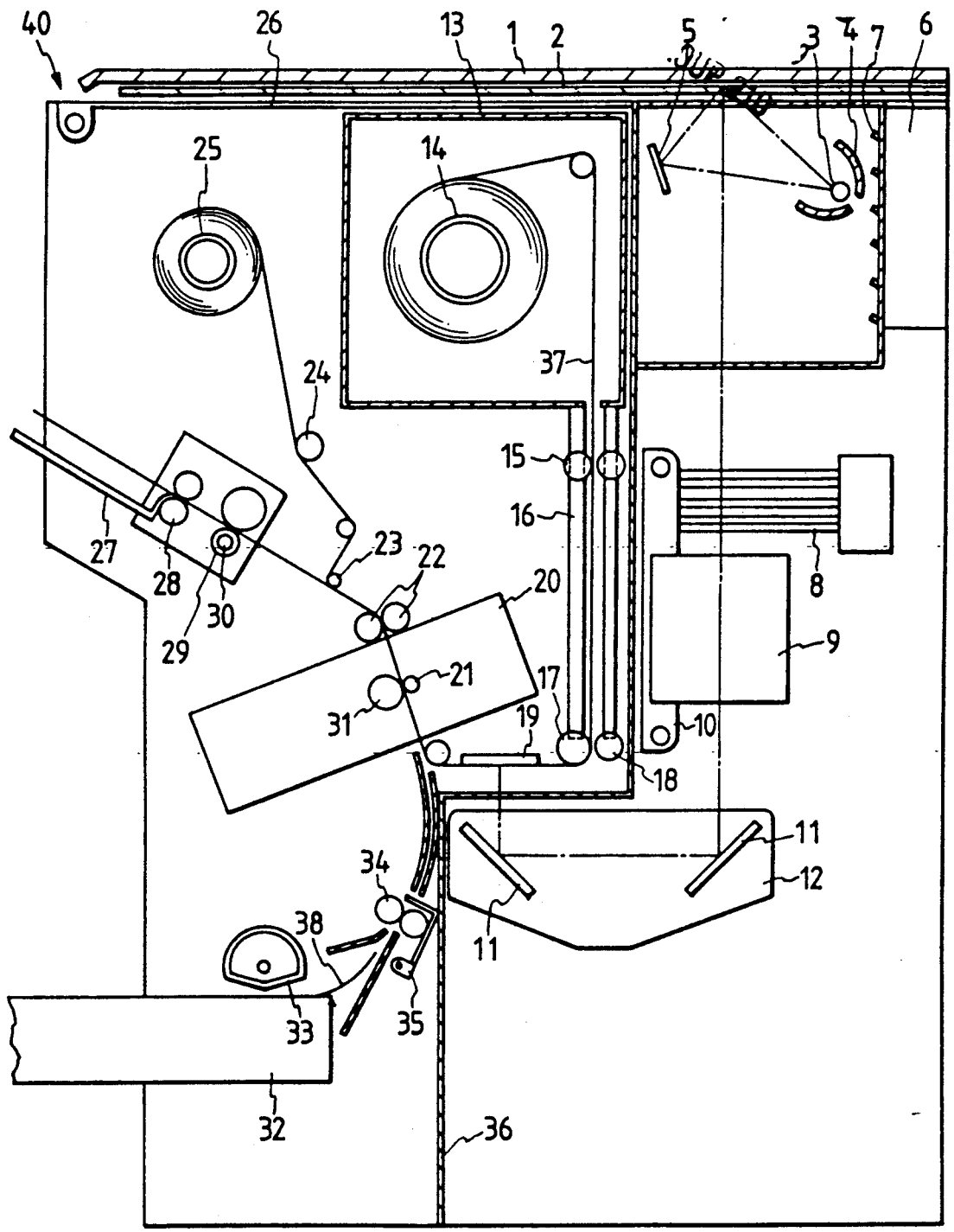
FIG. 1 is a schematic elevational view showing an image recording apparatus according to the present invention.

FIG. 1 shows an image recording apparatus capable of performing full-color copying. This apparatus employs a transfer type image recording mediums as described in U.S. Pat. No. 4,399,209. The transfer type image recording mediums, such as a photosensitive sheet, comprises a microcapsule sheet (first image recording medium) and a developer sheet (second image recording medium). More specifically, in the transfer type recording mediums, the developer material is coated on a separate substrate as a separate developer or copy sheet. The first image recording medium comprises a photosensitive pressure-sensitive recording medium provided with microcapsules which encapsulate therein a first material (chromogenic material or dye precursor) having first and second phases dependent on light exposure. The second image recording medium comprises the developer medium provided with a second material (developer material) which provides an output image upon reaction with the first material. Such image recording medium is disclosed in, for example, U.S. Pat. No. 4,399,209.

As shown in FIG. 1, the apparatus 40 generally includes an exposure unit and a pressure developing unit 20. The exposure unit includes an exposure stand 19. An exposure zone of the exposure unit is positioned adjacent to the pressure developing unit 20 as shown. This adjacent positional relationship is primarily advantageous in that the overall apparatus can be made compact. If, as in the conventional apparatus, a receiving unit is disposed between the exposure unit and the developing unit 20 for receiving exposed recording medium, the exposure and the developer units cannot be closely positioned, thus the entire apparatus is enlarged in size. Further advantages exist in such a close positioning of the two units that length of a non-treated or margin section of an elongated web-like microcapsule sheet 37, the margin being positioned between a leading pressure developing section of the sheet 37 and the following exposure section thereof, can be minimized, so that the sheet 37 is efficiently used.

Further, a light shielding partition plate 36 is disposed in the apparatus to divide internal space of the apparatus into two chambers. That is, an optical system bridging from the light source to the exposure unit is disposed within one chamber whereas other requisite units such as the pressure developing and thermal fixing units are disposed within another chamber.

The microcapsule sheet 37 is wound around a cartridge shaft 14, and is retained in a microcapsule sheet cartridge 13 that is detachably disposed at a position immediately below an original support stand glass 2 and is formed with a bottom opening. The exposure unit 19 is disposed below the sheet cartridge 13 at a downstream side thereof. The sheet 37 passes through a number of rollers and the pressure developing unit 20, and a leading end of the sheet 37 is attached to a take-up shaft 25 positioned beside the sheet cartridge 13.

Between the sheet cartridge 13 and the exposure unit 19, feed rollers 15, a barrel roller 17 and a guide roller 18 are rotatably provided at a vertical sheet path for guiding and transporting the sheet toward the exposure unit. The feed roller 15 is driven by a motor 54m (see FIG. 2). At the downstream side of the exposure unit 19, there is provided the pressure developing unit 20 which includes a small diameter roller 21 and a backup roller 31. The rollers 21 and 31 are provided for two purposes. One is to apply pressure to the recording medium to perform pressure development. The other is to feed the recording medium at a given speed (detailed description will be given later).

At a lower portion of the apparatus 40, there is provided a developer sheet cassette 32 for storing therein stack of developer sheets 38. Immediately above the cassette 32, a sector roller 33 is provided to feed the uppermost developer sheet 38 toward the pressure developing unit 20. Between the cassette 32 and the pressure developing unit 20, a roller 34 and a register gate 35 are provided so as to register the leading edge of the developer sheet 38.

At downstream side of the pressure developing unit 20, a pair of feed rollers 22 are provided so as to feed the sheets from the developing unit 20 at a given speed. At downstream side of the feed rollers 22, a separation roller 23 is provided at which the microcapsule sheet 37 is separated from the developer sheet 38. The separated microcapsule sheet 37 is taken-up by the above mentioned take-up shaft 25 through a meander travel control roller 24. On the other hand, a thermal fixing unit 30 is provided at the downstream side of the separation roller 23. The thermal fixing unit 30 includes a hollow heat roller 29 into which a heater element 30 is disposed. Further, a developer sheet feed roller 28 is provided to feed the image fixed developer sheet 38 toward a discharge tray 27.

Next, an optical system and optical path in the recording apparatus 40 will be described. As shown, the recording apparatus 40 has its top plate portion provided with a stand cover 1 and the original support stand glass 2. The original support stand glass 2 is made of a light transmissive material and is movable in the horizontal direction and on which a desired original (not shown) is placed with image face down. At the upper one side section (right side in FIG. 1), fixedly provided is a light source including a linear-shaped halogen lamp 3 extending in the direction perpendicular to the moving direction of the original support stand glass 2, and a semi-cylindrical reflector 4 disposed to surround the lamp 3. The light source emits a linear-line light ray to the original support stand glass 2.

Therefore, the light emitted from the halogen lamp 3 is sequentially irradiated onto the entire surface over the region from one to the other end of the original support stand glass 2 in accordance with the horizontal movement of the glass 2. The light from the light source passes through the transparent original support stand glass 2 and is reflected upon the original mounted thereon. The original support stand cover 1 which covers the top surface of the glass 2 is provided in order to prevent light leakage from the apparatus.

To irradiate the light from the halogen lamp 3 onto the original at a high efficiency, a flat reflector 5 is disposed on one side of the light source. The flat reflector 5 is disposed to direct scattering light toward the original and concentrate such reflected light onto the original.

At the rear side of the halogen lamp 3 there are provided a fan 6 and a louver 7 for introducing an external air into the apparatus. Accordingly, air is effectively impinged onto the light source to cool the same.

A filter 8 is disposed below the light source unit. A lens unit 9 is provided further below the filter 8. Light emitted from the halogen lamp 3 and reflected upon the original passes through the filter 8 and enters the lens 9. The filter 8 alters the light transmissive characteristic in accordance with the sensitivity characteristics of the microcapsule sheet 37, to thereby adjust the color tone of a copied output image. The lens 9 is fixedly secured to a lens mounting plate 10, and fine angular adjustment of this lens with respect to a light path can be achieved by adjusting the position of the plate 10.

A pair of reflection mirrors 11 are provided below the lens 9. The light having passed through the lens 9 changes its direction by 180 degrees (completely reverse direction) by way of the two reflection mirrors 11, and the thus oriented light strikes the microcapsule sheet 37, closely contacting the lower surface of the exposure table 19, to form the latent image thereon. The two reflection mirrors 11 are securely mounted on a plate 12. The mirror mounting plate 12 is fixedly secured to a main frame (not shown) of the apparatus 40, so that the adjustment of the length of the light path and focusing adjustment can be effected by fine adjustment of the position of the mirror mounting plate 12. The original (not shown), the filter 8, the lens 9, the pair of reflection mirrors 11 and the exposure table 19 define a U-shape or J-shape light path. That is, the optical path is bent into U-shape or J-shape so as to have a first vertical path directed downwardly, a second path directed horizontally and a third path directed upwardly. At the first optical path, a light reflected from the original is oriented downwardly, and at the third path the reflected light is directed toward the imaging surface of the microcapsule sheet 37 at the exposure zone, and the reflection mirror unit is disposed at the second optical path extending in horizontal direction. As a result, the mirror mounting plate 12 is adjustably movable in a direction parallel to the light path passing through the lens 9. Further, when the mirror mounting plate 12 is vertically moved by a certain distance, the total light path distance is changed (increased or decreased) by a distance twice as long as the certain distance, yet the focusing position at the exposure zone is maintained unchanged, since these mirrors can be moved in a direction parallel to the optical axis.

Operation of the copying apparatus thus constructed will be described.

The microcapsule sheet 37 taken out from the opening of the cartridge 13 is fed by the feed rollers 15 and guided by the rollers 17 and 18. By the rotation of the feed rollers 15, the sheet 37 is conveyed into the exposure unit while contacting a lower face of the exposure table 19 where original image carrying light is applied to the sheet 37, so that a latent image is formed on the sheet 37.

More specifically, the original support stand cover 1 is lifted up for mounting the original on the original support stand glass 2. Then, when a start button 50 (see FIG. 2) is depressed, the original support stand glass 2 is moved rightwardly to a position where the leftmost edge of the glass 2 is irradiated by the light from the light source 3. The original support stand glass 2 is then moved leftwardly at a first moving speed V1 while being irradiated by the light from the halogen lamp 3. The light emitted from the halogen lamp 3 is reflected upon the original, and the reflected light passes through the filter 8 and lens 9 and is reflected upon two reflection mirrors 11. The last reflected light is finally directed toward the microcapsule sheet 37 which is supported on the lower surface of the exposure table 19 to form the latent image on the sheet 37. At this time, the microcapsule sheet 37 is leftwardly moved through the exposure unit at a second moving speed V2 (V2=n.V1) where n represents a magnification/reduction factor. That is, the second speed V2 is the first moving speed V1 multiplied by the factor n. When the factor n is greater than 1 (one), the microcapsule sheet 37 is moved faster than the first moving speed V1 or the scanning speed, so that an enlarged size latent image is formed thereon in comparison with the size of the image on the original. On the other hand, when the factor n is smaller than 1 (one), the microcapsule sheet 37 is moved slower than the scanning speed, so that a reduced size latent image is formed thereon. When the factor n is equal to 1 (one), i.e. the microcapsule sheet 37 is moved at the same speed as the scanning speed, equi-size latent image is formed thereon. The change of the second speed V2 with respect to the first speed V1 causes only to enlarge or reduce the size of the original image in the scanning direction. It should be noted, however, that the enlargement or reduction of the original image in the widthwise direction thereof is accomplished by the lens 9 so as to agree with the enlargement or reduction in the direction of scanning.

The sheet 37 is then fed into the pressure developing unit 20 at the second speed V2 equal to the speed at which the sheet passes through the exposure unit. The developer sheets 38 are fed out one by one by the sector or woodruff roller 33, and each sheet 38 is fed to a sheet inlet of the pressure developing unit 20 after leading edge of the sheet 38 is registered by developer sheet rollers 34 and the register gate 35. At the pressure developing unit 20, the sheet 37 is brought into facial contact with the developer sheet 38. The microcapsule-carrying surface of the microcapsule sheet 37 on which a latent image is formed is in facial contact with the developer-coated surface of the developer sheet 38 at a position inside the pressure developing unit 20, and these superposed sheets are pressed together by the small-diameter roller 21 and the backup roller 31. Unexposed microcapsules are ruptured under the applied pressure to thereby form an output image on the developer sheet 38 because of the reaction of chromogenic material with the developer material.

Both the microcapsule sheet 37 and the developer sheet 38 are fed out of the pressure developing unit at a speed substantially equal to the second moving speed V2. That is, the small-diameter roller 21 and the backup roller 31 rotate to feed the sheets at the speed V2. In this manner, since the moving speed at which the microcapsule sheet 37 passes along the exposure zone is set substantially equal to the moving speed at which the superposed two sheets pass through the developing unit 20, the exposure and developing operations can be substantially simultaneously carried out.

The microcapsule sheet 37 and developer sheet 38 leaving the pressure developing unit 20 are fed out by the feed rollers 22 and are separated by the separation roller 23, the former sheet 37 directing upward and the latter sheet 38 directing in the straight direction.

Thereafter, the developer sheet 38 is subjected to thermal fixing in the thermal fixing unit 30 and is then discharged onto the discharge tray 27 with its image surface up. The microcapsule sheet 37 leaving the pressure developing unit 20 and passing through the separation roller 23 and the meandering control roller 24 is wound around the take-up shaft 25. When the movement of the original support stand glass 2 is stopped at a second position where another edge (right side in FIG. 1) of the glass 2 confronts the light source, the copying of the original is completed and the halogen lamp 3 is turned off.

Figure 2:
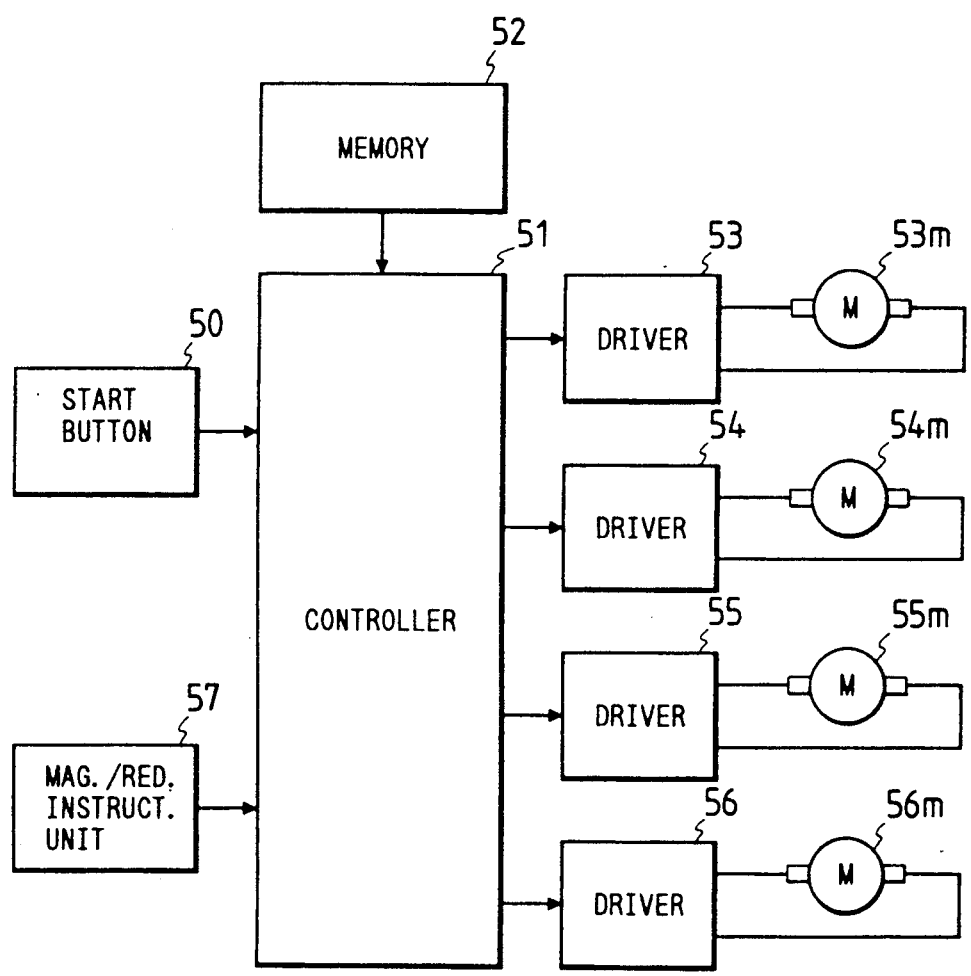
FIG. 2 is a block diagram showing a control unit for controlling drivers of various motors provided in association with feed rollers.

Referring to FIG. 2, description will be made with respect to a control unit for controlling the drivings of motors provided in association with the rollers for feeding the recording medium.

As shown in FIG. 2, the control unit includes a controller 51 to which the start button 50, a memory 52 and a magnification/reduction instructing unit 57 are coupled. Further coupled to the controller 51 are drivers 53 through 56 to which motors 53m through 56m are connected, respectively. The motor 53m is provided for moving the original support stand glass 2, the motor 54m for the feed roller 15, the motor 55m for the small-diameter roller 21, and the motor 56m for the feed rollers 22. The controller 51 operates in accordance with a program stored in the memory 52 and supplies driving signals to the drivers 53 through 56.

In operation, when the start button 50 is depressed, the controller 51 supplies a first driving signal to the driver 53 to rotate the motor 53m for a predetermined number of rotations, so that the original support stand glass 2 is moved rightwardly as described and stops at a position where the left side portion thereof is irradiated by the light from the lamp 3. Thereafter, the controller 51 supplies a second driving signal to the same driver to rotate the motor 53m in a reverse direction for the same number of rotations. In accordance with an instruction issued from the memory 52, the motor 53 is rotated at a predetermined constant speed, so that the original support stand glass 2 moves at the constant speed V1. In coincidence with the leftward movement of the original support stand glass 2, a driving signal is fed to the driver 54 for simultaneously moving the associated motor 54m. The motor 54m is rotated so that the microcapsule sheet 37 is conveyed at the speed V2, where V2 is equal to V1 multiplied by a magnification/reduction factor n. This factor n is instructed by the magnification/reduction factor instructing unit 57 and based upon the factor n instructed therefrom the controller 51 computes the rotational speed of the motor 54m so that V2=n.V1. In coincidence with the leftward movement of the stand glass 2, driving signals are further fed to the drivers 55 and 56 for simultaneously moving the associated motors 55m and 56m, respectively. The motors are rotated so that the microcapsule sheet 37 is conveyed at the same speed V2. It would be apparent that in determining the conveying speed of the microcapsule sheet 37, taking into account are not only the rotational speed of the motor but also the diameter of the roller.

In the above description, although four motors are separately employed for rotating the associated rollers and moving the stand glass 2, a signal motor would suffice if those are moved or rotated with the use of appropriately configured speed reduction mechanism, a clutch mechanism or the like. Although in FIG. 2 there are depicted only requisite components or units which are necessary for controlling the motors, other units are, as a matter of fact, coupled to the controller 51, such as, a light source controlling section, a developer sheet conveyance control section, a thermal fixing control section, a fan controlling section, all of which are not shown in FIG. 1. The light source controlling section is controlled in accordance with the program stored in the memory 52 so that the halogen lamp 3 is turned on when the original support stand glass 2 starts leftward movement. The developer sheet conveyance control section is also controlled in accordance with the program stored therein so that the sector roller 33 is actuated in timed relation to the conveyance of the microcapsule sheet 37. The thermal fixing control section is also controlled in accordance with the program stored therein so that the heater element 30 is energized in timed relation to the passage of the developer sheet 38 through the thermal fixing unit. The fan controlling section is controlled so that the fan 6 is driven when the apparatus is switched on.

While the invention has been described with reference to a specific embodiment thereof, it would be apparent for those skilled in the art that various changes and modifications can be made therein without departing from the spirit and scope of the invention. For example, the foregoing embodiment concerns the image recording apparatus using the photosensitive pressure sensitive recording medium. However, the present invention is also available for other types of photosensitive copying systems which employ toners. Further, the image recording apparatus may be modified so as to move the light source while maintaining the original support stand, having the original placed thereon, stationary. The developing unit may be moved while holding the microcapsule sheet stationary. Anyhow, the original and the light source are moved at the first speed relative to each other during the exposure to permit the microcapsule sheet to receive the light reflected from the original, and the exposed microcapsule sheet and the developer sheet are moved at the speed substantially equal to the first speed relative to each other. Accordingly, the exposing and developing processes can be executed at substantially the same speed, thus increasing the overall copying speed.

With the invention described above, a copying time is shortened, and it is not necessary to reserve space between the exposure unit and the developing unit for receiving the exposed microcapsule sheet, thus making the overall apparatus in compact size.

What is claimed is:

1. An image recording apparatus for recording an image of an original on an elongated web-like image recording medium, said image recording medium having an imaging surface capable of forming a latent image thereon when exposed to light, said apparatus comprising:

a pair of main frames defining an internal space therebetween;

a light source for irradiating light;

an original support unit for supporting said original to receive the light irradiated from said light source, said unit and said light source being movable at a first speed relative to each other so that said image on said original is sequentially scanned by said light;

an optical system secured to said main frames for receiving light reflected from said original and providing an image bearing light;

an exposure unit disposed within said internal space and defining an exposure zone through which said image recording medium is travelled wherein said image bearing light is controlled to form a latent image on said image recording medium;

a first driving unit for moving said recording medium at a feeding speed related to the first speed when said recording medium travels along the exposure zone;

a developing unit disposed downstream of said exposure unit and provided with a developing zone through which said recording medium passes for developing said latent image;

a second driving unit for moving said recording medium at a speed substantially equal to said feeding speed when said recording medium is developed by said developing unit; and magnification/reduction means for setting a magnification/reduction factor that applied to said first speed determines said feeding speed, wherein said first and said second driving units control said feeding speed of the recording medium corresponding to the magnification/reduction factor adjustment of said first speed.

2. An image recording medium apparatus for recording an image of an original on an elongated web-like image recording medium, said image recording medium having an image surface capable of forming a latent image thereon when exposed to light and transferring the latent image onto an image recording sheet, said apparatus comprising:

a pair of main frames defining an internal space therebetween;

a light source for irradiating light;

an original support unit for supporting said original to receive the light irradiated from said light source, said unit and said light source being movable at a first speed relative to each other so that said image on said original is sequentially scanned by said light;

an optical system secured to said main frames for receiving light reflected from said original and providing an image bearing light;

an exposure unit disposed within said internal space and defining an exposure zone along which said image recording medium is travelled wherein said image bearing light is directed to said image recording medium to form a latent image thereon;

a first driving unit for moving said recording medium at a feeding speed derived from the first speed when said recording medium travels along the exposure zone;

a developing unit disposed downstream of said exposure unit and provided with a developing zone through which said recording medium passes for developing said latent image;

a second driving unit for moving said recording medium at a speed substantially equal to said feeding speed when said recording medium is developed by said developing unit; and means for setting a magnification/reduction factor, said feeding speed being equal to said first speed multiplied by said magnification/reduction factor, wherein said first and said second driving units control said feeding speed of said image recording medium and said image recording medium comprises a photosensitive pressure-sensitive recording medium provided with microcapsules, said microcapsules encapsulating therein a first material having first and second phases dependent on light exposure, and said image recording sheet comprises a developer medium provided with a second material which provides an output image upon reaction with said first material.

3. An image recording apparatus for recording an image of an original on an elongated web-like image recording medium, said image recording medium having an imaging surface capable of forming a latent image thereon when exposed to light and transferring the latent image to an image recording sheet, said apparatus comprising:

a pair of main frames defining an internal space therebetween;

a light source for irradiating light;

an original support unit for supporting said original to receive the light irradiated from said light source, said unit and said light source being movable at a first speed relative to each other so that said image on said original is sequentially scanned by said light;

an optical system secured to said main frames for receiving light reflected from said original and providing an image bearing light;

an exposure unit disposed within said internal space and defining an exposure zone along which said image recording medium is travelled wherein said image bearing light is directed to said image recording medium to form a latent image thereon;

a first driving unit for moving said recording medium at a feeding speed related to the first speed when said recording medium travels along the exposure zone;

a developing unit disposed downstream of said exposure unit and provided with a developing zone wherein a image recording sheet is paired with said latent image on said recording medium and through which said recording medium and said recording sheet pass for developing said latent image;

a second driving unit for moving said recording medium and said recording sheet at a speed substantially equal to said feeding speed when being developed by said developing unit;

magnification/reduction means for setting a magnification/reduction factor; and a memory means for storing a program for using the magnification/reduction factor to determine said feeding speed, said feeding speed being equal to said first speed multiplied by said magnification/reduction factor.

4. An image recording apparatus as defined in claim 3, wherein said image recording medium comprises a photosensitive pressure-sensitive recording medium provided with microcapsules, said microcapsules encapsulating therein a first material having first and second phases dependent on light exposure, and said image recording sheet comprises a developer medium provided with a second material which provides an output image upon reaction with said first material.

5. The image recording apparatus as defined in claim 4, wherein said original support unit moves at said first speed and said light source unit stays stationary.

6. The image recording apparatus as defined in claim 5, further comprising a third driving unit disposed downstream of said developing unit for feeding said image recording medium and said image recording sheet at said feeding speed.

7. The image recording apparatus as defined in claim 4, wherein said light source unit moves at said first speed and said original support unit stays stationary.

8. The image recording apparatus as defined in claim 7, further comprising a third driving unit disposed downstream of said developing unit for feeding said image recording medium and said image recording sheet at said feeding speed.

* * * * *